(12) United States Patent
Wang et al.

(10) Patent No.: US 8,587,103 B2
(45) Date of Patent: Nov. 19, 2013

(54) INTEGRATED SENSING PACKAGE STRUCTURE

(75) Inventors: You-Fa Wang, Singapore (SG); Sin-Heng Lim, Singapore (SG); Teck-Chai Goh, Singapore (SG); Soon-Lee Tan, Singapore (SG)

(73) Assignee: Lite-On Singapore Pte. Ltd., Midview (SG)

( * ) Notice: Subject to any disclaimer, the term of this patent is extended or adjusted under 35 U.S.C. 154(b) by 10 days.

(21) Appl. No.: 13/282,541

(22) Filed: Oct. 27, 2011

(65) Prior Publication Data

US 2013/0105822 A1 May 2, 2013

(51) Int. Cl.
*H01L 31/09* (2006.01)
(52) U.S. Cl.
USPC .......... 257/678; 250/551; 250/338.1; 257/82
(58) Field of Classification Search
USPC ............ 257/433, 678; 250/338.1, 338.4, 551; 438/25
See application file for complete search history.

(56) References Cited

U.S. PATENT DOCUMENTS

| | | | |
|---|---|---|---|
| 4,309,605 A * | 1/1982 | Okabe | 250/239 |
| 6,590,152 B1 * | 7/2003 | Horio et al. | 174/354 |
| 8,097,852 B2 * | 1/2012 | Yao | 250/339.01 |
| 8,143,608 B2 * | 3/2012 | Yao et al. | 250/551 |
| 2002/0094177 A1 * | 7/2002 | Horio | 385/94 |
| 2008/0049210 A1 * | 2/2008 | Takaoka | 356/3 |
| 2011/0024627 A1 * | 2/2011 | Yao | 250/338.4 |
| 2011/0121181 A1 * | 5/2011 | Costello et al. | 250/338.1 |
| 2012/0086018 A1 * | 4/2012 | Yao et al. | 257/82 |
| 2012/0229797 A1 * | 9/2012 | Tang et al. | 356/51 |
| 2012/0298872 A1 * | 11/2012 | Tang et al. | 250/353 |

* cited by examiner

*Primary Examiner* — Steven Loke
*Assistant Examiner* — David Goodwin
(74) *Attorney, Agent, or Firm* — Li & Cai Intellectual Property (USA) Office

(57) ABSTRACT

An integrated Sensing package structure includes a substrate made of IR blocking material. The substrate has a first receiving compartment and a second receiving compartment concavely formed on the top surface thereof. The first receiving compartment has a reflective layer formed on the surface of the inner wall thereof. A LED unit is disposed in the bottom portion of the first receiving compartment. A plurality of first conducting lines is electrically connected to the LED unit and extends to an outer surface of the substrate. An IR sensing chip is disposed in the second receiving compartment. A plurality of second conducting lines is electrically connected to the IR sensing chip and extends to an outer surface of the substrate. An IR block cover is covered on the top surface of the substrate, forming at least one opening corresponding to the IR sensing chip.

8 Claims, 5 Drawing Sheets

INTEGRATED SENSING PACKAGE STRUCTURE

BACKGROUND OF THE INVENTION

1. Field of the Invention

The present invention relates to an integrated sensing package structure; in particular, to a sensor package structure having integrated proximity sensor and ambient light sensor (ALS).

2. Description of Related Art

Proximity sensors and ambient light sensors (ALS) are widely applied in the field of mobile phones, televisions and other portable mobile devices. They are able to sense the presence of a user and/or adjust the brightness of a display unit automatically according to the ambient conditions. Conventionally, the aforementioned devices, namely, the proximity and the ALS, are implemented separately to avoid mutual interference, e.g. to prevent the IR ray from the proximity sensor from interfering with the ALS. However, such stand-alone setup requires more space for accommodation and higher energy consumption.

Attempts have been made to provide an integrated sensor package structure. One existing package structure of integrated proximity sensor and ALS utilizes a cover unit made of metal or other IR blocking materials between an IR LED and a sensing chip to block IR crosstalk. However, the cover unit often requires a particular forming machine to manufacture, and the attachment of the cover unit onto the sensor unit (usually through gluing) is often insecure, making the cover unit easy to fall off.

To address the above issue, the inventors strive via industrial experience and academic research to present the instant disclosure, which can effectively improve the limitation described above.

SUMMARY OF THE INVENTION

The object of the present invention is to provide a sensor package structure having integrated proximity sensor and ALS wherein the radiant intensity of the LED radiation is increased and the influence of the cross-talk on the IR sensing chip can be avoided.

Another object of the present invention is to provide an integrated sensing package structure where a secure bond between the cover and the substrate is formed and the total cost is reduced.

In order to achieve the aforementioned objects, according to an embodiment of the present invention, an integrated sensing package structure is provided which comprises a substrate made of IR blocking material; the substrate has a first receiving compartment and a second receiving compartment concavely formed from a top surface thereof; the first receiving compartment has a reflective layer formed on an inner wall thereof; a LED unit is disposed in the bottom portion of the first receiving compartment; a plurality of first conducting lines is electrically connected to the LED unit and extends to an outer surface of the substrate; an IR sensing chip is disposed in the second receiving compartment; a plurality of second conducting lines is electrically connected to the IR sensing chip and extends to an outer surface of the substrate; an IR block cover is covered on the top surface of the substrate, forming at least one opening corresponding to the IR sensing chip.

The present invention includes the following advantages: the influence of the cross-talk on the IR sensing chip 14 can be avoided and a higher stability structure can be achieved, furthermore a higher LED radiant intensity is available.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1:
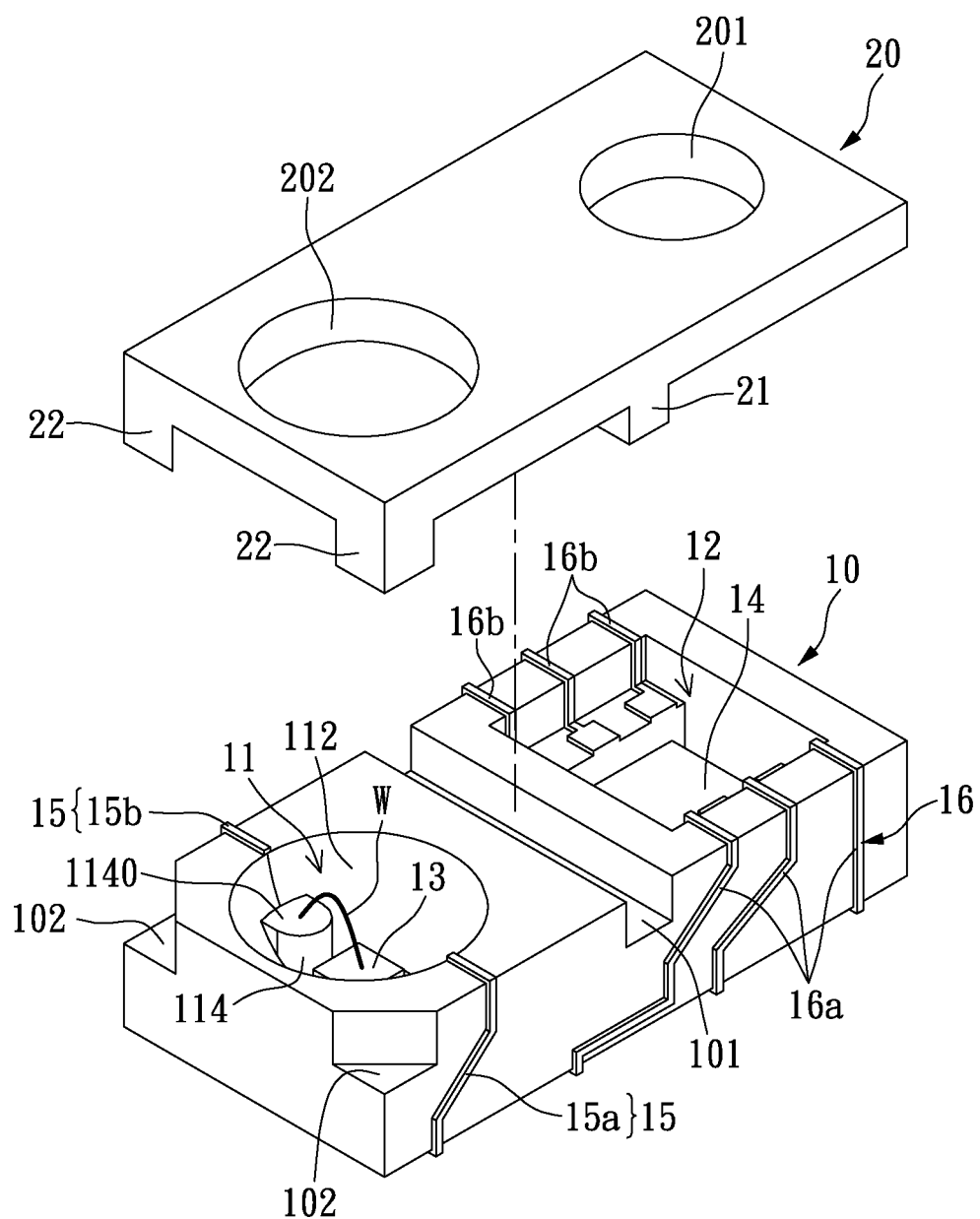
FIG. 1 shows a perspective exploded view of an integrated sensing package structure in accordance with the present invention.
Figure 2:
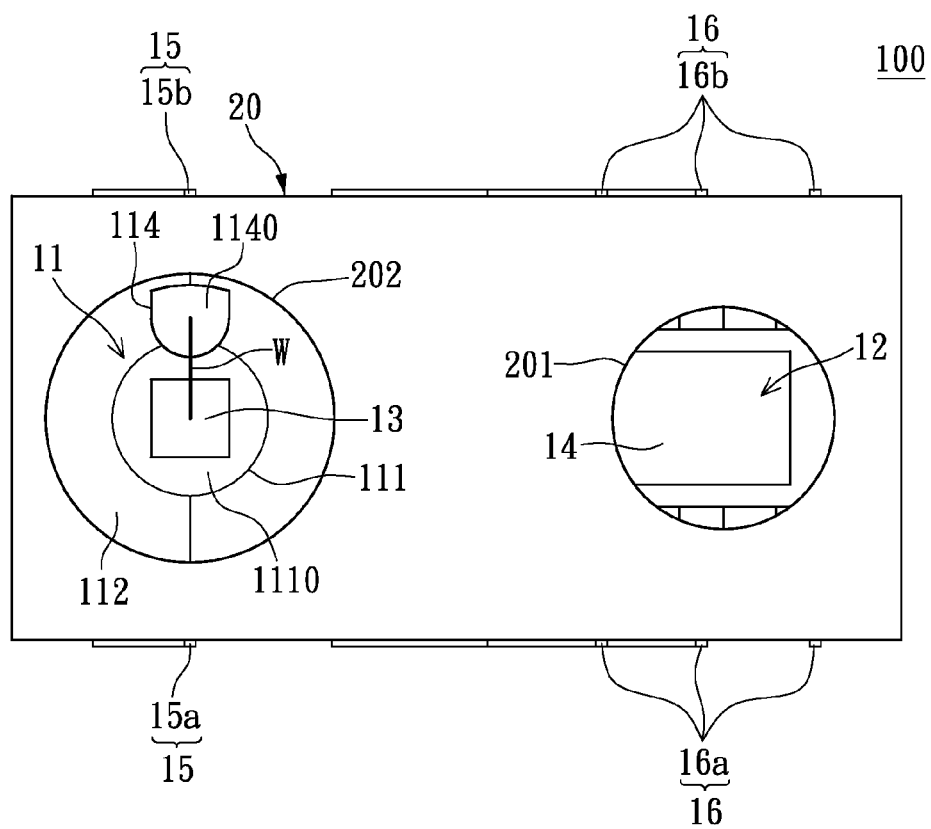
FIG. 2 shows a side-view of the integrated sensing package structure in accordance with the present invention.

Referring now to FIG. 1 & FIG. 2 which disclose a perspective exploded view and a side-view of an integrated sensing package structure 100 in accordance with a first embodiment of the present invention. The present invention provides an integrated sensing package structure 100 that integrates an ALS and a proximity sensor using reflection LED and IR shielding technologies.

The integrated sensing package structure 100 comprises a substrate 10 and a cover 20 covering on the top surface of the substrate 10. The substrate 10 includes a first receiving compartment 11 and a second receiving compartment 12 concavely formed on the top surface thereof for respectively receiving a LED unit 13 and an IR sensing chip 14 therein. The LED unit 13 is electrically communicative to the outside of the first receiving compartment 11 through a plurality of first conducting lines 15, while the IR sensing chip 14 establishes electrical connection to the outside of the second receiving compartment 12 via a plurality of second conducting lines 16. The LED unit 13, which is disposed in the bottom portion 111 of the first receiving compartment 11 and serves as the signal source for the proximity sensor, preferably comprises an infrared light emitting diode (IR LED) capable of emitting electromagnetic signals in the wavelength range of invisible infrared.

It is preferred that the substrate 10 in this embodiment is capable of IR blocking, for instance, a substrate 10 made from macromolecular material or painted with IR blocking liquid. By doing so, the IR from the LED unit 13 will be blocked and the influence of the cross-talk on the IR sensing chip 14 can be avoided. The first receiving compartment 11 of the substrate 10 has a reflective layer formed on an inner wall thereof, for instance, a metal layer form on the inner wall through electroplating. The reflective layer can assist in concentrating the IR from the LED unit 13, reducing the view angle of the LED, increasing the strength of radiation which further reduces the energy loss. In addition, the exposure of the IR from the LED unit can be reduced, decreasing its influence on the IR sensing chip 14.

Figure 7:
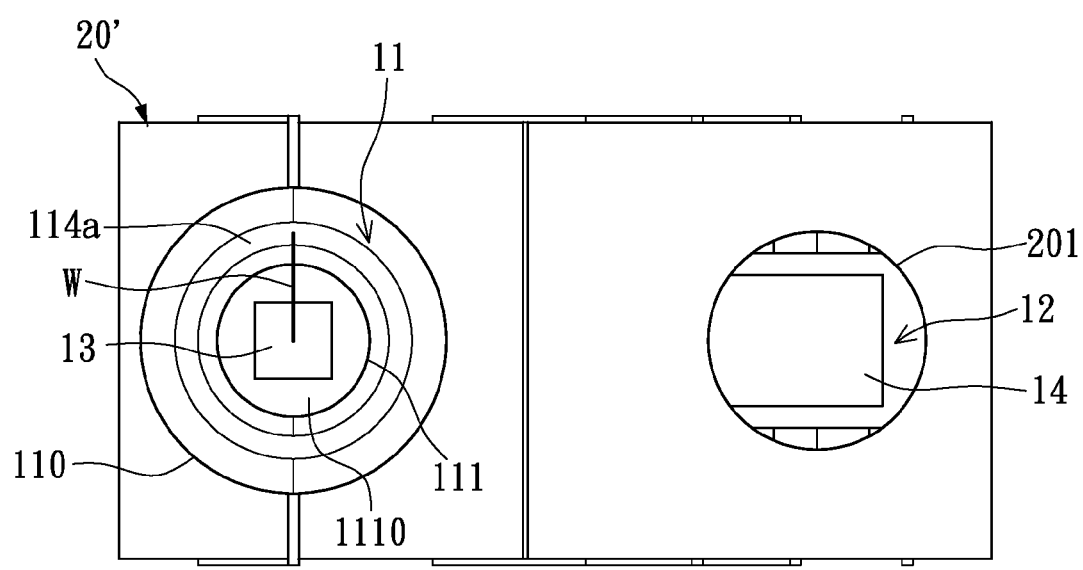
FIG. 7 shows a top-view of the integrated sensing package structure in accordance with a third embodiment of the present invention.

Referring now to FIG. 1, the first receiving compartment 11 has a bowl-like/cup-like shape, which comprises a bottom portion 111, an annular wall 112 encircling the bottom portion 111, and a bond-pad island 114 which is a region that protrudes partially from the annular wall 112. The bottom portion 111 of the first receiving compartment 11 is substantially flat; the surfaces of the bottom portion 111 and the bond-pad island 114 have a bonding pad 1110, 1140 each connected to the conducting lines 15a and 15b of the plurality of first conducting lines 15 respectively. This instant embodiment uses the bond-pad island 114 which protrudes from the annular wall 112 to connect with an electrode of the LED unit 13. The characteristic of this structure is that it is suitable even for proximity sensors of very small volume. However, the bond-pad island 114a in the present invention is not limited to by this, for instance, the bond-pad island can also protrude from the annular wall 112 in the form of annularity as shown in FIG. 7.

The LED unit 13 positioned on the bottom portion 111 uses a conducting wire W to connect with the bond-pad island 114 by mean of wire-bonding. The LED unit 13 of this embodiment has an electrode positioned in the bottom surface thereof and the electrode may be either an anode or a cathode, stabilized by a conductive epoxy and it is electrically connected to the bottom part 111; the electrode of the alternate polarity is positioned on the top surface of the LED unit 13 where a conductor wire is used to connect it with the bond-pad island 114.

In addition, another form of connecting the electrode of the LED unit 13 is introduced. The reflective layer, formed by electroplating a metal layer on the inner wall, can be separated to form the bottom portion 111 and the surface of the bond-pad island 114, for instance, divide the reflective layer by using laser into two separate regions after electroplating the inner wall of the first receiving compartment 11, then cover them on the bottom portion 111 and the bond-pad island 114. Meanwhile, the two separate regions also act as bonding pads are connected to the conducting lines 15a and 15b of the plurality of first conducting lines 15 respectively.

The second receiving compartment 12 is substantially a rectangular form where the plurality of second conducting lines 16 are divided into two sides of which each side owns 3 conducting lines 16a and 16b and are electrically connected to the IR sensing chip 14 in the form of wire-bonding. The aforementioned IR sensing chip 14, being a chip used in ALS, usually make use of the complementary metal-oxide-semiconductor process (CMOS process) to integrate the photodiode, the amplifiers and the analog/digital circuits into one single chip. The first receiving compartment 11 and the second receiving compartment 12 is being sealed by epoxy after wire-bonding in order to protect the conducting wire, the LED unit 13 and the IR sensing chip 14.

To simplify the assembly of the substrate 10 and the cover 20 of the present invention, the top surface of the substrate 10 can form a plurality of concave structures, likewise the cover 20 forms a plurality of convex structures corresponding to the concave structures of the substrate 10, forming a secure bond between the two structures. In this embodiment, the concave structures include a segregation channel 101 formed between the first receiving compartment 11 and the second receiving compartment 12, and a diagonal channel 102 concave partially in the two corners of the substrate 10, away from the second receiving compartment 12. The convex structures includes a rib 21 disposed within the segregation channel 21 and a corner lump 22 disposed within the corner channel 102 correspondingly. The corner lump 22 of the cover 20 and the corner channel 102 of the substrate 10 may be used to ensure proper alignment during assembly, reducing manufacturing error during assembly process.

It is preferred that the cover 20 to be IR blocking, for instance, a substrate 10 made from macromolecular material or painted with IR blocking liquid. The present invention does not require metal plate to block IR hence reducing cost in comparison to the prior arts. In addition, the IR from the LED unit 13 can also be blocked in order to avoid the influence of cross-talk on IR sensing chip 14. Two openings 201, 202 are formed on the cover 20 corresponding to the IR sensing chip 14 and the LED unit 13 respectively to allow light to pass through. The IR reflected by the objects pass through the opening 201 to reach the IR sensing chip 14.

Figure 3:
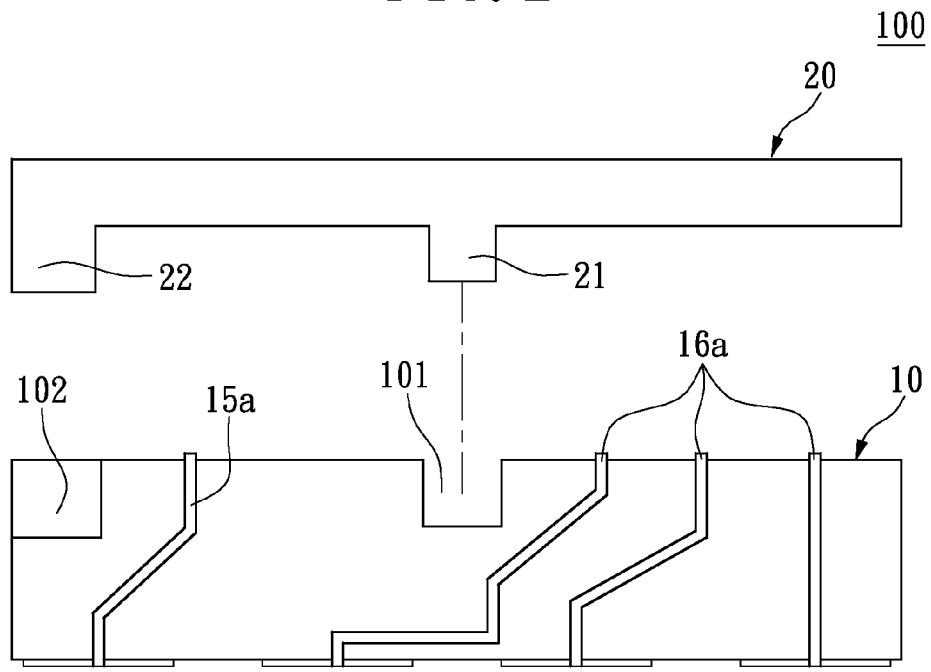
FIG. 3 shows a top-view of the integrated sensing package structure in accordance with the present invention.

As the material of the cover 20 and the substrate 10 is identical or very similar, a more stable assembly is formed. After assembly as shown in FIG. 3, the openings 201, 202 can define the view angle of the IR sensing chip 14 and the LED unit 13. However, the cover 20 of the present invention is not limited to by this, for instance, it may comprise a single opening and the detail description will be introduced in the following.

Referring now to FIGS. 1-3, the plurality of first conducting lines 15 in this embodiment is electrically connected to the LED unit 13 and extends to the outer surface of the substrate 10. One end of the plurality of second conducting lines 16 is disposed within the second receiving compartment 12 and is electrically connected to the related juncture of the top surface of the IR sensing chip 14 by mean of wire-bonding where the other end extends to the outer surface of the substrate 10. A better mean of implementation of the conducting lines is the use of the Microscopic Integrate Process Technology (MIPTEC). In the making of the substrate 10 through a plastic injection process, the circuits, bond pads, and solder pads may all be included in a mold and integrally formed as a single unit.

Please refer to FIG. 3. Each of the plurality of first/second conducting lines (15/16) includes a terminal portion that extends to the bottom surface of the integrated package structure and forms a conducting pad. The conducting pads formed on the bottom surface of the package structure enables the utilization of surface mount technology (SMT) when deploying the instantly disclosed sensor package unit.

Figure 4:
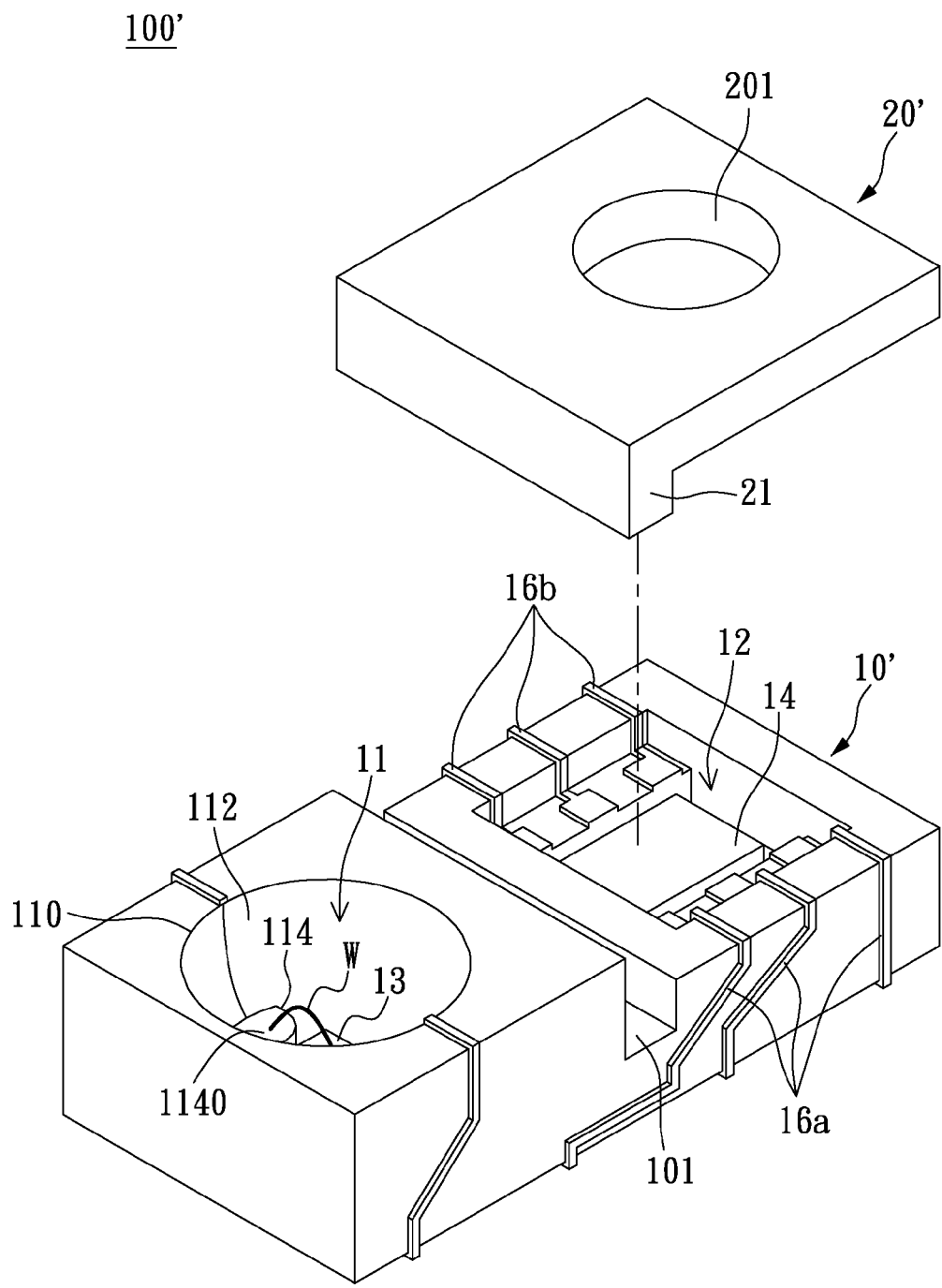
FIG. 4 shows a perspective exploded view of an integrated sensing package structure in accordance with a second embodiment of the present invention.
Figure 5:
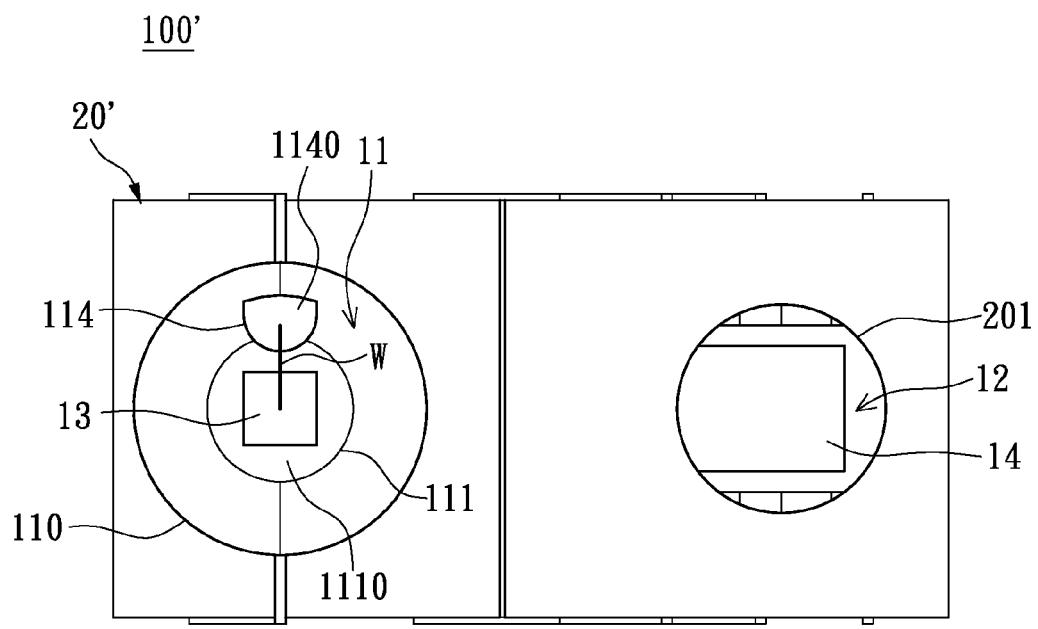
FIG. 5 shows a side-view of the integrated sensing package structure in accordance with a second embodiment of the present invention.
Figure 6:
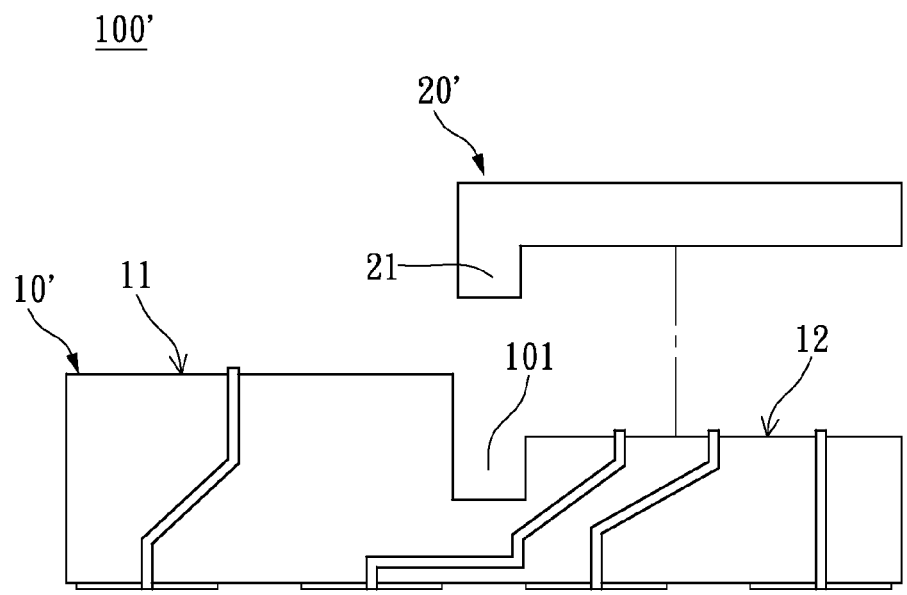
FIG. 6 shows a top-view of the integrated sensing package structure in accordance with a second embodiment of the present invention.

Referring now to FIGS. 4-6, which disclose another embodiment of the integrated sensing package structure of the present invention. It differs from the aforementioned embodiment as the first receiving compartment 11 of the substrate 10' of the integrated sensing package structure 100' is higher than the second receiving compartment 12; the cover 20 only covers the second receiving compartment 12 and has one single opening 201 corresponding to the IR sensing chip 14. The opening 201 defines the view angle of the first receiving compartment 11. One end of the cover 20' has a rib 21 and the substrate 10 has a segregation channel 101 formed between the first receiving compartment 11 and the second receiving compartment 12.

Additionally, the integrated sensing package structure of the present invention can form multiple substrates 10 within a larger plate when a plurality of the first conducting lines 15 and the second conducting lines 16 are attached in advance.

Furthermore, a plurality of LED unit 13 and IR sensing chips 14 can be placed within while a larger cover is provided, forming a plurality of covers 20. Finally, the process of cutting is proceeded to begin developing volume production capabilities of the integrated sensing package structure.

Therefore, the integrated sensing package structure of the present invention acquires the following functions and characteristics:

Firstly, the present invention uses the technology of the reflection LED and the IR shielding to integrate the ALS and the proximity sensor into an integrated sensing package structure. It can also be in the form of 2 in 1 integration (the LED and the proximity sensor) or 3 in 1 integration (the LED, proximity sensor and the ALS).

Secondly, the reflection LED provides stronger radiation intensity and a higher emitting efficiency to detect a longer distance. The substrate and the cover can block IR, reducing the interference of IR cross-talk.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. An integrated sensing package structure, comprising:
  an IR blocking substrate including a first receiving compartment and a second receiving compartment concavely formed on a top surface thereof, wherein the first receiving compartment is substantially bowl-like shaped and has a reflective layer formed on a surface of an inner wall thereof;
  wherein the first receiving compartment has a bottom portion being substantially flat, an annular wall encircling the bottom portion thereof, and a bond-pad island protrudingly arranged on the annular wall; wherein a surface of the bottom portion and the bond-pad island each has a bonding pad;
  a LED unit disposed on the bottom portion of the first receiving compartment and connected with the bonding pad of the bond-pad island by mean of wire-bonding;
  a plurality of first conducting lines enabling electrical connection of the LED unit from the interior of the first receiving compartment and extended to an outer surface of the substrate;
  an IR sensing chip disposed in the second receiving compartment;
  a plurality of second conducting lines enabling electrical connection of the IR sensing chip from the interior of the second receiving compartment and extended to an outer surface of the substrate; and
  an IR blocking cover covering the top surface of the substrate, having at least one opening defined thereon corresponding to the IR sensing chip.

2. The integrated sensing package structure according to claim 1, wherein a plurality of concave structures is formed on the top surface of the substrate, and a plurality of convex structures is formed on the cover corresponding to the concave structures of the substrate; wherein the convex structures are disposed in the concave structures.

3. The integrated sensing package structure according to claim 2, wherein each of the concave structures comprises a segregation channel formed between the first receiving compartment and the second receiving compartment, and at least one corner channel concaves partially in one corner of the substrate, wherein each of the convex structures comprises a rib disposed within the segregation channel, and at least one corner lump disposed within the corner channel correspondingly.

4. The integrated sensing package structure according to claim 3, wherein there are two openings formed on the cover corresponding to the IR sensing chip and the LED unit.

5. The integrated sensing package structure according to claim 1, wherein the bond-pad island protrudes from the annular wall partially.

6. The integrated sensing package structure according to claim 1, wherein the bond-pad island protrudes from the annular wall in the form of annularity.

7. The integrated sensing package structure according to claim 1, wherein the reflective layer is a metallic layer separated and respectively formed on the surface of the bottom portion of the first receiving compartment and the bond-pad island.

8. The integrated sensing package structure according to claim 1, wherein the first conducting lines and the second conducting lines each has one end extending to a bottom surface of the substrate to form a solder pad.

* * * * *